US012787659B2

(12) United States Patent
Zhao et al.

(10) Patent No.: US 12,787,659 B2
(45) Date of Patent: Nov. 3, 2026

(54) QUANTUM DEVICE, MANUFACTURING METHOD THEREOF, AND QUANTUM COMPUTER

(71) Applicant: ORIGIN QUANTUM COMPUTING TECHNOLOGY (HEFEI) CO., LTD, Anhui (CN)

(72) Inventors: Yongjie Zhao, Anhui (CN); Ye Li, Anhui (CN); Xiaoguang Wang, Anhui (CN); Xiaochuan Wang, Anhui (CN)

(73) Assignee: ORIGIN QUANTUM COMPUTING TECHNOLOGY (HEFEI) CO., LTD., Anhui (CN)

( * ) Notice: Subject to any disclaimer, the term of this patent is extended or adjusted under 35 U.S.C. 154(b) by 417 days.

(21) Appl. No.: 18/533,716

(22) Filed: Dec. 8, 2023

(65) Prior Publication Data

US 2024/0114805 A1 Apr. 4, 2024

Related U.S. Application Data

(63) Continuation of application No. PCT/CN2022/128213, filed on Oct. 28, 2022.

(30) Foreign Application Priority Data

Nov. 12, 2021 (CN) ........................ 202111336960.1

(51) Int. Cl.
*H10N 60/81* (2023.01)
*H10N 69/00* (2023.01)

(52) U.S. Cl.
CPC ............. *H10N 60/81* (2023.02); *H10N 69/00* (2023.02)

(58) Field of Classification Search
CPC ........ H10N 60/81; H10N 69/00; H10N 60/20; G06N 10/40
See application file for complete search history.

(56) References Cited

U.S. PATENT DOCUMENTS

| | | | | |
|---|---|---|---|---|
| 2021/0397944 | A1* | 12/2021 | Lakshmanan | G06F 9/30036 |
| 2022/0309376 | A1* | 9/2022 | Kong | G06N 10/40 |
| 2023/0376276 | A1* | 11/2023 | Li | G06F 7/535 |
| 2024/0119335 | A1* | 4/2024 | Yang | G06N 10/40 |
| 2025/0216706 | A1* | 7/2025 | Staffaroni | G02B 6/12 |
| 2025/0344614 | A1* | 11/2025 | Bestwick | G06N 10/40 |

* cited by examiner

*Primary Examiner* — Thao P Le
(74) *Attorney, Agent, or Firm* — IPkey PLLC

(57) ABSTRACT

A quantum device includes: a quantum chip, provided with an I/O port; and a superconducting substrate, provided with transmission lines on the superconducting substrate. Each of the transmission lines includes a first section and a second section that form an included angle, a bonding connection structure is formed between one end of the first section and the I/O port, a pad for connecting to a connector is formed at one end of the second section, and a distribution spacing between the first sections is smaller than a distribution spacing between the second sections. The second sections are distributed in a region away from the quantum chip. The first section connected to the I/O port via aluminum wire bonding can be wired at higher density. The size of the pad on a wiring spacing is reduced, and density of the transmission lines on the superconducting substrate is increased.

13 Claims, 4 Drawing Sheets

QUANTUM DEVICE, MANUFACTURING METHOD THEREOF, AND QUANTUM COMPUTER

CROSS-REFERENCES TO RELATED APPLICATIONS

This application is a United States Continuation Application from International Application No. PCT/CN2022/128213, filed on Oct. 28, 2022, which claims priority to Chinese Patent Application No. 202111336960.1, filed on Nov. 12, 2021, the entire disclosures of each of which are incorporated herein by reference.

This application claims priority to Chinese Patent Application No. 202111336960.1, entitled "QUANTUM DEVICE, MANUFACTURING METHOD THEREOF, AND QUANTUM COMPUTER" and filed with the China Patent Office on Nov. 12, 2021, the entire contents of which are incorporated herein by reference.

TECHNICAL FIELD

The present disclosure belongs to the field of quantum information, especially the technical field of quantum computing. In particular, the present disclosure relates to a quantum device, a manufacturing method thereof, and a quantum computer.

BACKGROUND

Quantum computing is a new computing manner which combines quantum mechanics and computer science by following laws of quantum mechanics and controlling quantum information units. The quantum computing uses qubits composed of microscopic particles as basic units, and is featured with quantum superposition and entanglement. Moreover, through controlled evolution of quantum states, the quantum computing can realize information encoding and computing storage, and has a huge amount of information carrying capacity and a super parallel computing processing capability unmatched by a classical computing technology. As a number of qubits increases, a computing storage capability thereof may expand exponentially. Physical systems of quantum computing that are being explored internationally include ion traps, superconductivity, ultra-cold atoms, polarized molecules, linear optics, diamond color centers, electron or nuclear spins in silicon 28, and other directions.

In order to realize input and output of control signals and read signals, it is indispensable to connect a quantum chip with a peripheral circuit. In the solution of superconducting quantum computing, the quantum chip is generally connected to a printed circuit board (PCB) by wire bonding to form a packaging structure, and is led out through switching of the PCB so as to be connected to the peripheral circuit. As the number of qubits increases, how to achieve high-density wiring in the packaging structure of the quantum chip to lead out a large number of I/O ports when the quantum chip is packaged is a problem to be urgently solved at present.

SUMMARY

In view of the problems in the prior art, the present disclosure is intended to provide a quantum device and a quantum computer, which can achieve high-density wiring to lead out a large number of I/O ports when the quantum chip is packaged.

Some embodiments of the present disclosure provide a quantum device, including:

a quantum chip, provided with an I/O port; and a superconducting substrate, provided with transmission lines on the superconducting substrate, wherein each of the transmission lines includes a first section and a second section that form an included angle, a bonding connection structure is formed between one end of the first section and the I/O port, a pad for connecting to a connector is formed at one end of the second section, and a distribution spacing between the first sections is smaller than a distribution spacing between the second sections.

In the quantum device as described above, the pad includes a first-type pad distributed on a first alignment reference line and a second-type pad distributed on a second alignment reference line, and the first-type pad and the second-type pad are distributed alternately.

In the quantum device as described above, first sections of the transmission lines at adjacent positions have different lengths.

In the quantum device as described above, a wiring groove is formed at the superconducting substrate, and the transmission lines are formed in the wiring groove.

In the quantum device as described above, the transmission lines are configured as a printed circuit.

In the quantum device as described above, the printed circuit includes a first grounding layer, a second grounding layer, a signal line layer located between the first grounding layer and the second grounding layer, and a conductive structure for electrically connecting the first grounding layer and the second grounding layer.

In the quantum device as described above, the conductive structure includes a through hole passing through the first grounding layer and the second grounding layer, and a conductive element formed in the through hole, and the conductive element is electrically connected to the first grounding layer and the second grounding layer.

In the quantum device as described above, the transmission lines are configured as a stacked element, and the stacked element includes a first oxide film layer, a transmission dielectric layer with superconducting property, and a second oxide film layer stacked in sequence; and the transmission dielectric layer is configured to connect to the I/O port and the connector.

In the quantum device as described above, the quantum device includes superconducting substrates stacked in sequence.

In the quantum device as described above, in two of the superconducting substrates adjacent to each other, a mounting hole is provided in an upper superconducting substrate, and the mounting hole is configured to fix a connector connected to the pad on a lower superconducting substrate.

In the quantum device as described above, each of the superconducting substrates is provided with a window, and the bonding connection structure connects the transmission line and the I/O port through the window.

Some embodiments of the present disclosure provide a quantum computer, including the quantum device as described above.

Some embodiments of the present disclosure provide a method for manufacturing a quantum device, including:

providing a quantum chip provided with an I/O port; and providing a superconducting substrate, forming transmission lines on the superconducting substrate, wherein each of the transmission lines includes a first section and a second section that form an included angle, a pad for connecting to a connector is formed at one end of the second section, a bonding connection structure is formed between one end of the first section and the I/O port, and a distribution spacing between the first sections is smaller than a distribution spacing between the second sections.

In the prior art, the distribution spacing of the transmission lines without division is affected by the size of the pad, which makes it difficult to achieve high-density arrangement of the transmission lines. However, in the present disclosure, the transmission line on the superconducting substrate is divided into two parts. That is, each transmission line includes a first section and a second section that have an included angle, and the second sections with a pad formed at one end are distributed in a region of the superconducting substrate away from the quantum chip. Then, the first section connected to the I/O port by aluminum wire bonding can be wired at higher density in a region of the superconducting substrate near the quantum chip. Therefore, an effect of the size of the pad on a wiring spacing is reduced, and density of the transmission lines on the superconducting substrate is increased.

BRIEF DESCRIPTION OF DRAWINGS

In order to more clearly illustrate the technical solutions in some embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art from the provided drawings without creative efforts.

REFERENCE SIGNS

Figure 1:
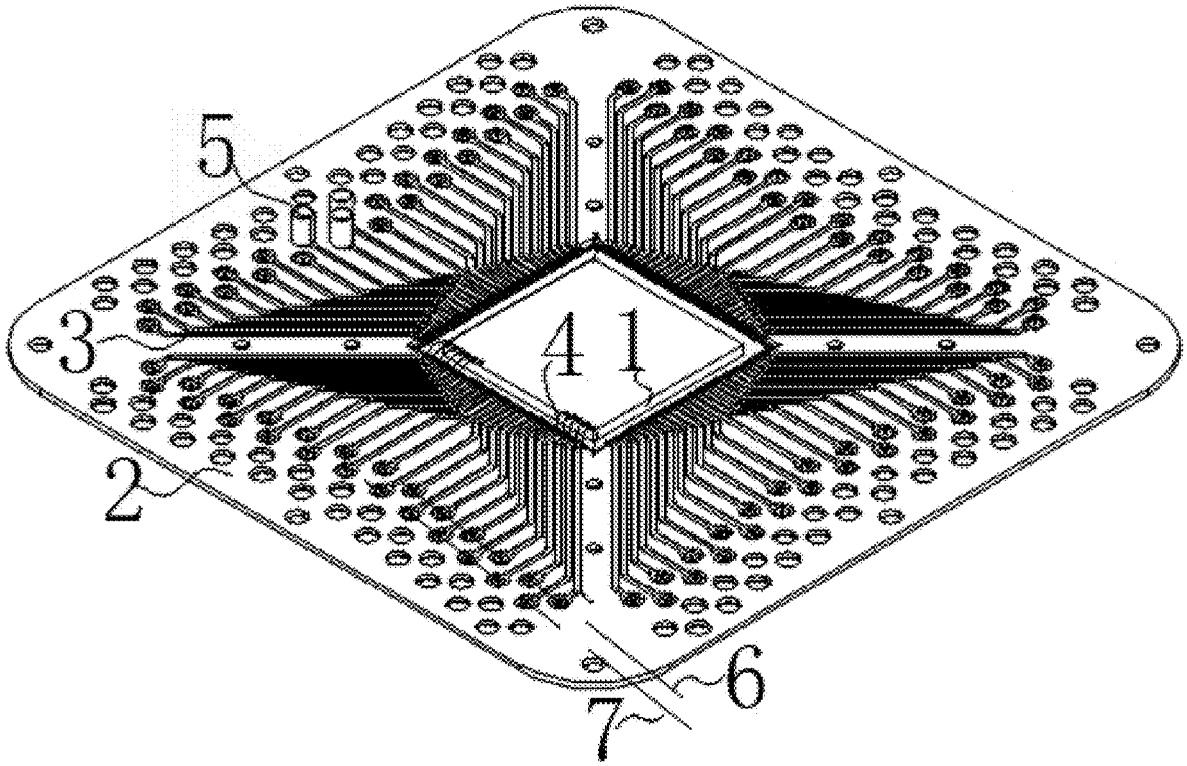
FIG. 1 is a schematic diagram of a quantum device according to the present disclosure.

1: quantum chip;
2: superconducting substrate, 21: wiring groove, 22: window, 23: mounting hole,
3: transmission line, 31: first section, 32: second section, 33: pad, 34: bonding pad,
4: bonding connection structure, 5: connector, 6: first alignment reference line, 7: second alignment reference line,
8: printed circuit, 81: first grounding layer, 82: dielectric, 83: signal line layer, 84: conductive structure, 85: second grounding layer,
9: stacked element, 91: first oxide film layer, 92: transmission dielectric layer, 93: second oxide film layer

DESCRIPTION OF EMBODIMENTS

The following detailed description is merely illustrative and is not intended to limit embodiments and/or application or uses of embodiments. In addition, there is no intention to be bound by any expressed or implied information presented in the preceding Background or Summary sections, or in the Detailed Description section.

To make objectives, technical solutions, and advantages of embodiments of the present disclosure clearer, one or more embodiments are now described with reference to the accompanying drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. The embodiments may be combined with each other and mutually referenced without contradiction.

It should be noted that the terms "first", "second", and the like, in the specification and claims of the present disclosure and in the foregoing drawings are used for distinguishing similar objects and not necessarily for describing a particular order or a sequential order. It should be understood that data thus used is interchangeable in proper circumstances, such that the embodiments of the present disclosure described herein can be implemented in orders except the orders illustrated or described herein. In addition, the terms "include" and "have" and any other variants thereof are intended to cover the non-exclusive inclusion. For example, a process, method, system, product, or device that includes a series of steps or units is not necessarily limited to those expressly listed steps or units, but may include other steps or units not expressly listed or inherent to such process, method, product, or device.

In addition, it should be understood that when a layer (or film), region, pattern, or structure is referred to as being "on" a substrate, layer (or film), region, and/or pattern, it may be directly on another layer or substrate, and/or there may be an insertion layer. In addition, it should be understood that when a layer is referred to as being "under" another layer, it may be directly under another layer, and/or there may be one or more insertion layers. In addition, for "on" a layer and "under" a layer, reference may be made to the drawings.

Under the background of rapid development of a quantum computing technology, the present disclosure discloses a quantum device suitable for a large number of qubits. For example, during execution of quantum computing based on a quantum chip, in order to realize input and output of control signals and read signals for the quantum chip, there is generally a need to connect a quantum chip with a peripheral circuit. For example, in the solution of superconducting quantum computing, the quantum chip is generally connected to a PCB by wire bonding to form a packaging structure, and is led out through transmission lines formed on the PCB so as to be connected to the peripheral circuit. Besides, the transmission lines in the prior art are generally linear, and distribution spacings thereof are affected by sizes of pads of the transmission lines. As the number of qubits increases, this structural form is difficult to achieve high-density wiring and meet a need to lead out a large number of I/O ports of the quantum chip.

To this end, the present disclosure provides a quantum device and a quantum computer, which can achieve high-density wiring to lead out a large number of I/O ports when the quantum chip is packaged. In the present disclosure, a transmission line 3 on a superconducting substrate 2 is divided into two parts, i.e., a first section 31 and a second section 32 that form an included angle, so as to lead out part of the transmission line 3 along different directions. Compared with the transmission line 3 without division in the prior art, in the present disclosure, the second sections 32 with a pad 33 formed at one end are distributed in a region of the superconducting substrate away from the quantum chip 1. Then, the first section 31 connected to the I/O port by a bonding connection structure 4 can be wired at higher density in a region of the superconducting substrate near the quantum chip 1. Therefore, an effect of the size of the pad 33 on a wiring spacing is reduced, and density of the transmission lines 3 on the superconducting substrate 2 is increased.

FIG. 1 is a schematic diagram of a quantum device according to the present disclosure.

Referring to FIG. 1, the present disclosure provide a quantum device, including:

a quantum chip 1, provided with an I/O port; and a superconducting substrate 2, provided with transmission lines 3 on the superconducting substrate 2, wherein each of the transmission lines 3 includes a first section 31 and a second section 32 that form an included angle, a bonding connection structure 4 is formed between one end of the first section 31 and the I/O port, a pad 33 for connecting to a connector 5 is formed at one end of the second section 32, and a distribution spacing between the first sections 31 is smaller than a distribution spacing between the second sections 32.

It may be understood that the I/O port is a signal transmission port of an element such as a pulse modulation signal line, a magnetic flux modulation signal line, or a read signal line located on the quantum chip 1. In the present disclosure, corresponding signal ports are led out by using the transmission lines 3 on the superconducting substrate 2, to facilitate a connection with the connector 5 of the peripheral circuit. In the prior art, the transmission lines 3 without division are generally linear, and distribution spacings thereof are affected by sizes of the pads 33. Compared with the prior art, in the quantum device provided in the present disclosure, each transmission line 3 on the superconducting substrate 2 is divided into two parts, i.e., a first section 31 and a second section 32 that form an included angle. The second sections 32 with the pad 33 formed at one end are distributed in a region of the superconducting substrate 2 away from the quantum chip 1. Then, the first section 31 connected to the I/O port by a bonding connection structure 4 can be wired at higher density in a region of the superconducting substrate 2 near the quantum chip 1. Therefore, an effect of the size of the pad 33 on a wiring spacing is reduced, and density of the transmission lines on the superconducting substrate 2 is increased.

In some embodiments of the present disclosure, the pad 33 includes a first-type pad distributed on a first alignment reference line 6 and a second-type pad distributed on a second alignment reference line 7, and the first-type pad and the second-type pad are distributed alternately. A spacing between the first alignment reference line 6 and the second alignment reference line 7 is determined according to sizes of the first-type-pad and the second-type pad, a size of the connector 5, and a signal crosstalk requirement. It is to be noted that the first alignment reference line 6 and the second alignment reference line 7 are references for determining an arrangement relationship between the pads, and are not structures actually manufactured on the quantum device or the superconducting substrate 2. The first alignment reference line 6 indicates that the first-type pad is arranged along a straight line, and the second alignment reference line 7 indicates that the second-type pad is arranged along a straight line. Referring to FIG. 1, the quantum device or the superconducting substrate 2 may be divided into regions, the first alignment reference line 6 and the second alignment reference line 7 are determined in each region, the first-type pad in a same region is arranged along the first alignment reference line 6, and the second-type pad in a same region is arranged along the second alignment reference line 7. In some embodiments of the present disclosure, first sections 31 of the transmission lines 3 at adjacent positions have different lengths to disperse the corresponding pads 33.

The bonding connection structure 4 is generally a wire of transition connection between the I/O port of the quantum chip 1 and the transmission line 3 on the superconducting substrate 2. For example, a port of the transmission line 3 on the superconducting substrate 2 may be connected to the I/O port of the quantum chip 1 through a small wire (for example, a small wire made of aluminum or other materials). The wire may be further configured to connect a grounding component of the quantum chip 1 and the superconducting substrate 2 to a common ground.

When the number of qubits or the number of other elements on the quantum chip 1 increases, it may cause the number of wires to increase and the wires to be closer. The closer the wires are, the more connections or crosstalk may occur between the wires, which means that when a signal is sent through a first wire, the signal may leak to another wire (e.g., a second wire) near the first wire. The first wire and the second wire are separated by a distance of approximately 1.5 mm. The wire may be made of aluminum and/or niobium, or other materials with superconducting property. In addition, the wire may include a diameter ranging from about 15 μm to several hundred μm. In some embodiments, a separation distance between the wires is chosen based on a size of the quantum chip and a desired number of qubits. A separation distance between the wires is configured to minimize or keep crosstalk between the wires within an acceptable range.

The transmission line 3 may be designed to be about 50Ω, or another desired impedance. The transmission line 3 may be directly formed on the superconducting substrate 2 through a semiconductor process, or may be manufactured separately and then attached to the superconducting substrate 2. For example, a required PCB structure is first formed and then fixed to the superconducting substrate 2 through conductive glue.

Figure 2:
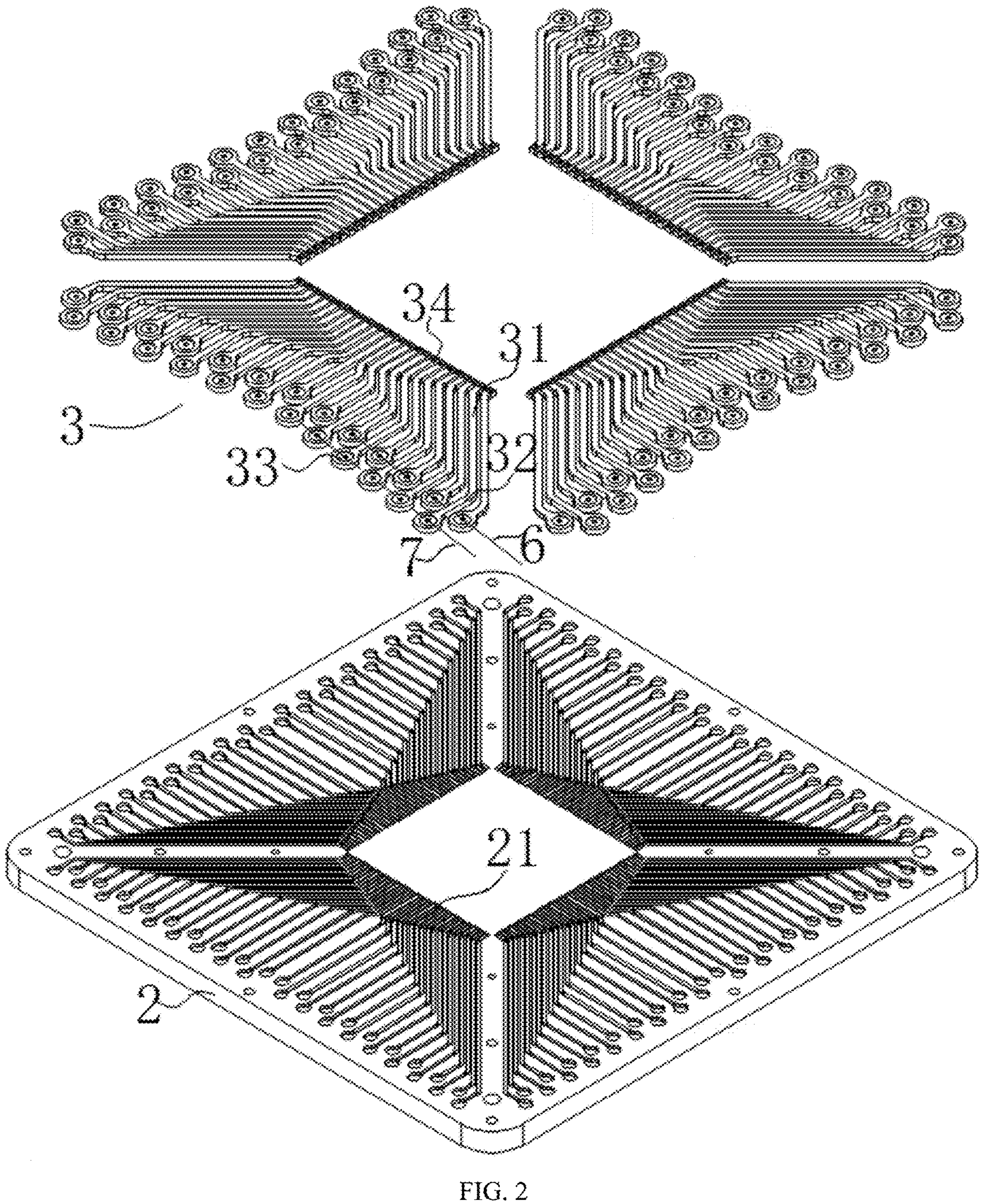
FIG. 2 is a schematic diagram of a second quantum device according to the present disclosure.

FIG. 2 is a schematic diagram of a second quantum device according to the present disclosure, which illustrates an exploded structure of the second quantum device.

Referring to FIG. 2 together with FIG. 1, in some embodiments of the present disclosure, a wiring groove 21 is formed at the superconducting substrate 2, and the transmission lines 3 are formed in the wiring groove 21. The wiring groove 21 with superconducting property can form good isolation and reduce crosstalk between the transmission lines 3.

Figure 3:
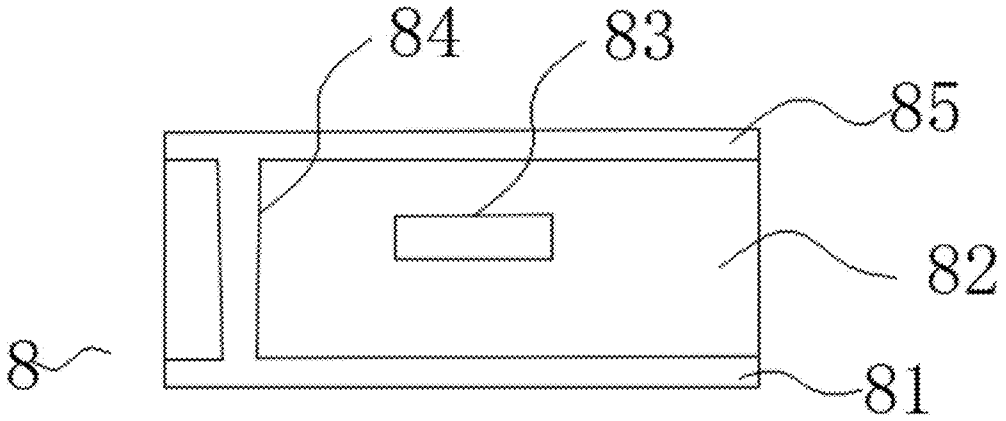
FIG. 3 is a schematic diagram of a printed circuit according to the present disclosure.

FIG. 3 is a schematic diagram of a printed circuit provided, which schematically shows a cross-sectional structure of a printed circuit 8.

Figure 5:
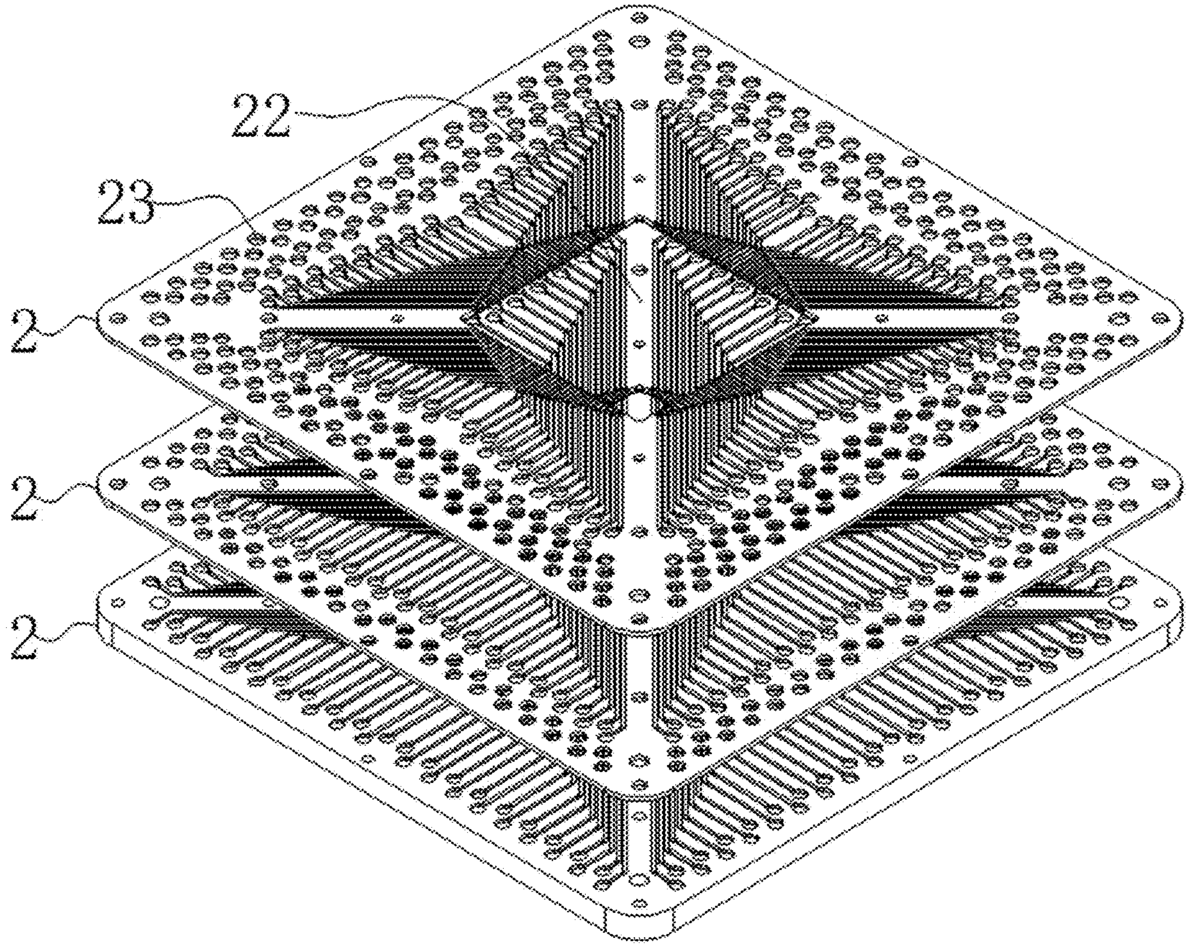
FIG. 5 is a schematic diagram of a third quantum device according to the present disclosure.

Referring to FIG. 3 together with FIG. 1 and FIG. 2, in some embodiments of the present disclosure, the transmission lines 3 are configured as a printed circuit 8. For example, the printed circuit 8 includes a first grounding layer 81, a second grounding layer 85, a signal line layer 83 located between the first grounding layer 81 and the second grounding layer 85, and a conductive structure 84 for electrically connecting the first grounding layer 81 and the second grounding layer 85. During specific implementation, the conductive structure 84 includes a through hole passing through the first grounding layer 81 and the second grounding layer 85, and a conductive element formed in the through hole, and the conductive element is electrically connected to the first grounding layer 81 and the second grounding layer 85. The conductive element may be a dielectric layer plated on an inner wall of the through hole or a dielectric material filling up the through hole through a process such as deposition. FIG. 5 is a schematic diagram of a third quantum device according to the present disclosure. For example, the quantum device may alternatively be in a structural form including superconducting substrates 2 stacked in sequence. The transmission line 3 is formed in the structure of the printed circuit 8 on each superconducting substrate 2, and the superconducting substrates 2 stacked in sequence are in electrical contact to facilitate a common-ground connection. For example, each of the superconducting substrates 2 is provided with a window 22, and the bonding connection structure 4, such as an aluminum wire, connects the transmission line 3 and the I/O port through the window 22.

Figure 4:
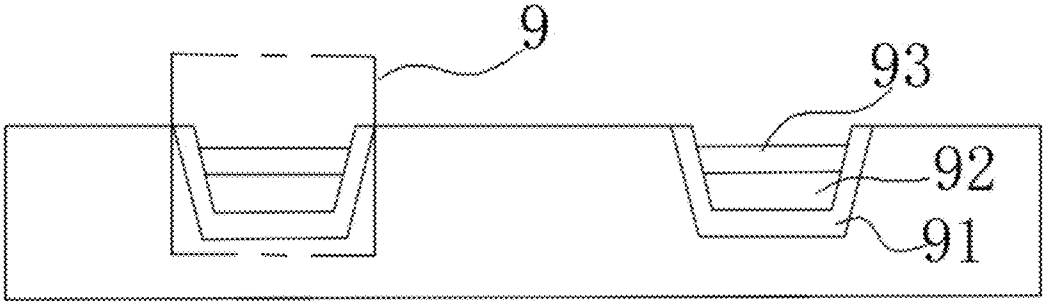
FIG. 4 is a schematic diagram of a stacked element according to the present disclosure.

FIG. 4 is a schematic diagram of a stacked element provided, which schematically shows a cross-sectional structure of a stacked element 9.

Referring to FIG. 4 together with FIG. 1 and FIG. 2, in some embodiments of the present disclosure, the transmission lines 3 are configured as a stacked element 9. The stacked element 9 includes a first oxide film layer 91, a transmission dielectric layer 92 with superconducting property, and a second oxide film layer 93 stacked in sequence. The transmission dielectric layer 92 is configured to connect to the I/O port and the connector 5. The transmission dielectric layer 92 with superconducting property is a material with superconducting property within a critical temperature range. FIG. 5 is a schematic diagram of a third quantum device according to the present disclosure. For example, the quantum device may alternatively be in a structural form including superconducting substrates 2 stacked in sequence. The transmission line 3 is formed in the structure of the stacked element 9 on each superconducting substrate 2, and the superconducting substrates 2 stacked in sequence are in electrical contact to facilitate a common-ground connection. For example, each of the superconducting substrates 2 is provided with a window 22, and the bonding connection structure 4, such as an aluminum wire, connects the transmission line 3 and the I/O port through the window 22.

During specific implementation, referring to FIG. 5 together with FIG. 1 to FIG. 4, an example of the structural form of the superconducting substrates 2 stacked in sequence is described as follows: in two of the superconducting substrates 2 adjacent to each other, a mounting hole 23 is provided in an upper superconducting substrate 2, and the mounting hole 23 is configured to fix a connector 5 connected to the pad 33 on a lower superconducting substrate 2.

Some embodiments of the present disclosure further provide a quantum computer. The quantum computer includes the quantum device as described in the above embodiments.

It is to be noted herein that the quantum device in the above quantum computer is similar to the above structure and has a same beneficial effect as the above quantum device embodiment. Therefore, details are not described. For technical details not disclosed in the embodiments of the quantum computer in the present disclosure, those skilled in the art can refer to the description of the above quantum device. To save space, details are not described herein again.

Some embodiments of the present disclosure further related to a method for manufacturing a quantum device, including:

providing a quantum chip 1 provided with an I/O port; and providing a superconducting substrate 2, provided with transmission lines 3, wherein each of the transmission lines 3 includes a first section 31 and a second section 32 that form an included angle, a pad 33 for connecting to a connector 5 is formed at one end of the second section 32, a bonding connection structure 4 is formed between one end of the first section 31 and the I/O port, and a distribution spacing between the first sections 31 is smaller than a distribution spacing between the second sections 32.

Prior to the step of forming transmission lines 3 on the superconducting substrate 2, the method further includes the following step:

forming a wiring groove 21 at the superconducting substrate 2, the wiring groove 21 being configured to accommodate the transmission lines 3.

For example, the step of forming transmission lines 3 on the superconducting substrate 2 includes: oxidizing an inner surface of the wiring groove 21 to form a first oxide film layer 91; depositing a material with superconducting property on the first oxide film layer 91 to form a transmission dielectric layer 92 for connecting to the I/O port and the connector 5; and finally oxidizing a surface of the transmission dielectric layer 92 to obtain a second oxide film layer 93.

It may be understood that, when the surface of the transmission dielectric layer 92 is oxidized, in order to ensure electrical property of the connection of the transmission dielectric layer 92 with the I/O port and the connector 5, part of the transmission dielectric layer 92 may be retained so as not to be oxidized, or the second oxide film 93 on part of the transmission dielectric layer 92 can be removed by a process such as etching after the surface of the transmission dielectric layer 92 is completely oxidized.

When the first oxide film layer 91 is formed on the surface of the superconducting substrate 2, the first oxide film layer 91 may be formed in the following manner forming an oxide film layer of a desired thickness by exposing the surface of the superconducting substrate 2 to a predetermined concentration of oxygen at a predetermined temperature and predetermined pressure for a predetermined amount of time. In some embodiments, the superconducting substrate 2 is made of aluminum (i.e., Al), and the oxide film layer includes aluminum oxide (i.e., $Al_2O_3$). In some embodiments, the concentration of oxygen for forming the oxide film layer is 100% pure oxygen. Oxidation time may range from one minute to hundreds of minutes, at room temperature, and at pressures in the order of a few millitorr to tens of torr. The desired thickness of the oxide film is in the order of several angstroms to tens of angstroms. In some embodiments, the superconducting substrate 2 is made of niobium (i.e., Nb), and the first oxide film layer 91 includes niobium oxide (e.g., NbO, $NbO_2$, or $Nb_2O_5$). The second oxide film layer 93 may alternatively be formed on the transmission dielectric layer 92 by using a chemical vapor deposition (CVD) process or other processes. In some embodiments, the second oxide film layer 93 includes a material matching the transmission dielectric layer 92 (for example, an oxide of a same type of material). For example, when the transmission dielectric layer 92 includes niobium, the second oxide film layer 93 includes niobium oxide. In some embodiments, the second oxide film layer 93 is planarized. For example, the second oxide film layer 93 is planarized by using a chemical mechanical polishing (CMP) process. Thicknesses of the first oxide film layer 91 and the second oxide film layer 93 range from 20 nm and 3000 nm. In some embodiments of the present disclosure, the superconducting material may include one or more of aluminum (Al), niobium (Nb), niobium nitride (NbN), titanium nitride (TiN), and niobium titanium nitride (NbTiN). For example, in the present disclosure, an oxide film with high density and thickness may be formed by using an anodizing process or a plasma oxidation process.

The anodizing process is an electrolytic passivation process that may be employed to increase a thickness of an oxide layer on a surface of a metal. A current (e.g., a direct current) passes through a circuit that includes an electrolytic solution and a metal to be treated, with the metal to be treated serving as an anode (i.e., a positive electrode). The current releases hydrogen at a cathode (i.e., a negative electrode) and oxygen at the surface of the metal to be treated (i.e., anode electrode), which forms a metallic oxide on the metal to be treated. A thickness of the oxide layer depends on magnitude of a power supply and an amount of time a voltage is applied to the circuit.

Plasma oxidation is an electrochemical surface treatment process for generating oxide coatings on metals. An electromagnetic source may be used to transform oxygen gas into oxygen plasma that is directed towards a metallic object. When the resulting oxygen plasma is applied to a surface of a metal, an oxide coating grows on the surface of the metal. The oxide coating is a chemical conversion of the metal into its oxide, which grows on the surface of the metal. Since the oxide coating is non-conductive, plasma oxidation may generally be employed to passivate the surface of the metal.

A method for manufacturing a quantum device provided in some embodiments of the present disclosure may entail deposition of one or more materials, such as superconductors, dielectrics and/or metals. Depending on the selected materials, these materials may be deposited by using a deposition process such as chemical vapor deposition or physical vapor deposition (e.g., evaporation or sputtering), or an epitaxial technology, and other deposition processes. Processes for manufacturing a quantum device provided in some embodiments of the present disclosure may entail removal of one or more materials from a device during manufacturing. Depending on the material to be removed, the removal process may include, for example, a wet etching technology, a dry etching technology, or a lift-off process. The materials forming the circuit elements described herein may be patterned by using a known lithographic technology (e.g., photolithography or e-beam lithography).

The constructions, features, and functions of the present disclosure are described in detail in the embodiments with reference to the accompanying drawings. The foregoing is merely preferred embodiments of the present disclosure, but the implementation scope of the present disclosure is not limited by the accompanying drawings. All equivalent embodiments that are modified or changed according to the concept of the present disclosure and do not depart from the spirit of the specification and the drawings should fall within the protection scope of the present disclosure.

What is claimed is:

1. A quantum device, comprising:

a quantum chip, provided with an I/O port; and a superconducting substrate, provided with transmission lines on the superconducting substrate, wherein each of the transmission lines comprises a first section and a second section that form an included angle, a bonding connection structure is formed between one end of the first section and the I/O port, a pad for connecting to a connector is formed at one end of the second section, and a distribution spacing between the first sections is smaller than a distribution spacing between the second sections.

2. The quantum device according to claim 1, wherein the pad comprises a first-type pad distributed on a first alignment reference line and a second-type pad distributed on a second alignment reference line, and the first-type pad and the second-type pad are distributed alternately.

3. The quantum device according to claim 1, wherein first sections of the transmission lines at adjacent positions have different lengths.

4. The quantum device according to claim 1, wherein a wiring groove is formed at the superconducting substrate, and the transmission lines are formed in the wiring groove.

5. The quantum device according to claim 4, wherein the transmission lines are configured as a printed circuit.

6. The quantum device according to claim 5, wherein the printed circuit comprises a first grounding layer, a second grounding layer, a signal line layer located between the first grounding layer and the second grounding layer, and a conductive structure for electrically connecting the first grounding layer and the second grounding layer.

7. The quantum device according to claim 6, wherein the conductive structure comprises a through hole passing through the first grounding layer and the second grounding layer, and a conductive element formed in the through hole, and wherein the conductive element is electrically connected to the first grounding layer and the second grounding layer.

8. The quantum device according to claim 4, wherein the transmission lines are configured as a stacked element, and the stacked element comprises a first oxide film layer, a transmission dielectric layer with superconducting property, and a second oxide film layer stacked in sequence; and the transmission dielectric layer is configured to connect to the I/O port and the connector.

9. The quantum device according to claim 1, wherein the quantum device comprises superconducting substrates stacked in sequence.

10. The quantum device according to claim 9, wherein in two of the superconducting substrates adjacent to each other, a mounting hole is provided in an upper superconducting substrate, and the mounting hole is configured to fix a connector connected to the pad on a lower superconducting substrate.

11. The quantum device according to claim 9, wherein each of the superconducting substrates is provided with a window, and the bonding connection structure connects the transmission line and the I/O port through the window.

12. A quantum computer, comprising a quantum device, wherein the quantum device, comprises:

a quantum chip, provided with an I/O port; and a superconducting substrate, provided with transmission lines on the superconducting substrate, wherein each of the transmission lines comprises a first section and a second section that form an included angle, a bonding connection structure is formed between one end of the first section and the I/O port, a pad for connecting to a connector is formed at one end of the second section, and a distribution spacing between the first sections is smaller than a distribution spacing between the second sections.

13. A method for manufacturing a quantum device, comprising:

providing a quantum chip provided with an I/O port; and providing a superconducting substrate, and forming transmission lines on the superconducting substrate, wherein each of the transmission lines comprises a first section and a second section that form an included angle, a pad for connecting to a connector is formed at one end of the second section, a bonding connection structure is formed between one end of the first section and the I/O port, and a distribution spacing between the first sections is smaller than a distribution spacing between the second sections.

* * * * *